US006864180B2

(12) United States Patent
Restaino et al.

(10) Patent No.: US 6,864,180 B2
(45) Date of Patent: Mar. 8, 2005

(54) METHOD FOR REWORKING LOW-K POLYMERS USED IN SEMICONDUCTOR STRUCTURES

(75) Inventors: Darryl D. Restaino, Modena, NY (US); Delores Bennett, Poughkeepsie, NY (US); John A. Fitzsimmons, Poughkeepsie, NY (US); John Fritche, New Paltz, NY (US); Jeffrey C. Hedrick, Montvale, NJ (US); Chih-Chien Liu, Fishkill, NY (US); Shahab Siddiqui, Wappingers Falls, NY (US); Christy S. Tyberg, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 09/969,363

(22) Filed: Oct. 2, 2001

(65) Prior Publication Data

US 2003/0062336 A1 Apr. 3, 2003

(51) Int. Cl.⁷ .............................. H01L 21/311
(52) U.S. Cl. ............... 438/700; 438/723; 438/725; 438/745
(58) Field of Search .................. 438/700–714, 438/717, 723–725

(56) References Cited

U.S. PATENT DOCUMENTS

| | | | |
|---|---|---|---|
| 5,920,764 A | | 7/1999 | Hanson et al. ............ 638/4 |
| 6,071,806 A | | 6/2000 | Wu et al. ............... 438/622 |
| 6,114,250 A | * | 9/2000 | Ellingboe et al. ......... 438/709 |
| 6,150,073 A | | 11/2000 | Huang .................. 438/313 |
| 6,156,374 A | | 12/2000 | Forbes et al. ............ 427/97 |
| 6,159,845 A | | 12/2000 | Yew et al. .............. 438/637 |
| 6,187,661 B1 | | 2/2001 | Lou .................... 438/622 |
| 6,340,435 B1 | * | 1/2002 | Bjorkman et al. ......... 216/72 |
| 6,365,228 B1 | * | 4/2002 | Tsai et al. .............. 427/240 |
| 6,465,159 B1 | * | 10/2002 | Ni et al. ............... 430/314 |
| 6,472,335 B1 | * | 10/2002 | Tsai et al. ............. 438/780 |

OTHER PUBLICATIONS

Wolf et al., Silicon Processing for the VLSI Era, 1986, vol. 1, pp. 532–534.*
E.O. Shaffer II, "Fracture Mechanics of Thin Film Dielectrics," Sep. 2000.
E.O. Shaffer II, K.E. Howard, M.E. Mills, and P.H. Townsend, "On the Mechanical Integrity of Ultra–Low Dielectric Constant Materials for Use in BEOL Structures," Apr. 25, 2000, pp. 1–24.
"SiLK* Semiconductor Dielectric Resins: The SiLK Story," The Dow Chemical Company 1995–2000, http://www.dow.com.
"SiLK* Semiconductor Dielectric Resins: Products—Products Families" The Dow Chemical Company 1995–2000, http://www.dow.com/silk/products/index.htm.
"SiLK* Semiconductor Dielectric Resins: Products—SiLK I Semiconductor Dielectric" The Dow Chemical Company 1995–2000, http://www.dow.com/silk/products/silki.htm.
SiLK* I Semiconductor Dielectric, Dow Chemical Company.
Material Safety Data Sheet for XU 35114 Series of Developmental SiLK* I Semiconductor Dielectrics, pp. 1–9.
SiLK H Semiconductor Dielectric, Dow Chemical Company.
Material Safety Data Sheet for XU 35116 Series of Developmental SiLK* H Semiconductor Dielectrics, pp. 1–9.
AP4000 Adhesion Promoter, Dow Chemical Company.
Material Safety Data Sheet for XU 35117.00 Developmental Adhesion Promoter AP4000, pp. 1–8.

* cited by examiner

Primary Examiner—Duy-Vu Deo
(74) Attorney, Agent, or Firm—Cantor Colburn LLP

(57) ABSTRACT

A method for removing a dielectric layer formed upon a semiconductor substrate is disclosed. In an exemplary embodiment of the invention, the method includes subjecting the dielectric layer to a dry etch process and subjecting an adhesion promoter layer underneath the dielectric layer to a wet etch process.

14 Claims, 3 Drawing Sheets

METHOD FOR REWORKING LOW-K POLYMERS USED IN SEMICONDUCTOR STRUCTURES

BACKGROUND

The present invention relates generally to semiconductor device processing and, more particularly, to removing cured and uncured organic polymers used as low-k dielectrics in semiconductor structures.

In the fabrication of integrated circuit devices, it is often desirable to isolate individual components of the integrated circuits from one another with insulative materials. Such insulative materials may include, for example, silicon dioxide, silicon nitride and undoped silicon. While these materials may have acceptable insulating properties in many applications, they also have relatively high dielectric constants, which can lead to capacitive coupling between proximate conductive elements. This is particularly disadvantageous, given the ever-decreasing distances between conductive circuit elements, and the use of multi-layered structures. An unnecessary capacitive coupling between adjacent wires increases the RC time delay of a signal propagated therethrough, resulting in decreased device performance. Thus, for specific applications, insulating materials having relatively low dielectric constants (e.g., $\kappa<3$) are desired.

Certain organic polymers are known in the semiconductor manufacturing industry for their "low-k" dielectric properties, which polymers are often used for intermetallic insulation in damascene structures. An example of one such polymer is SiLK®, manufactured by The Dow Chemical Company. SiLK® is typically applied to semiconductor wafers by spin-on coating in a wafer track, similar to the process used in the application of photolithography resist. Initially in liquid form during the spin-on coating, the SiLK® material dries quickly after the coating, thereby creating peaks and valleys of topography as it blankets device features having distinct step heights.

However, as is the case with other process operations, the possibility exists that the application of a spin-on polymer, such as SiLK®, is carried out incorrectly for a variety of possible reasons (e.g., equipment malfunction or human error). Thus, in order to salvage valuable semiconductor wafers, it is economically desirable to have a functional rework process that fully removes the dielectric coating without eroding any underlying films on the wafer.

BRIEF SUMMARY

The foregoing discussed drawbacks and deficiencies of the prior art are overcome or alleviated by a method for removing a dielectric layer formed upon a semiconductor substrate. In an exemplary embodiment of the invention, the method includes subjecting the dielectric layer to a dry etch process and subjecting an adhesion promoter layer underneath the dielectric layer to a wet etch process. In a preferred embodiment, the dry etch process further comprises an oxygen inductively coupled plasma (ICP) etch which causes the adhesion promoter layer to become oxidized. The adhesion promoter layer has a first general chemical composition of $SiO_xC_y$ prior to the dry etch process and a second general chemical composition of $SiO_x$ following the dry etch process. The ICP etch has an etch selectivity of at least 1000:1 with respect to the adhesion promoter layer. Furthermore, the wet etch process comprises a dilute hydrofluoric acid (DHF) etch, which has an etch selectivity of at least 5:1 with respect to a layer underneath the adhesion promoter layer.

BRIEF DESCRIPTION OF THE DRAWINGS

Referring to the exemplary drawings wherein like elements are numbered alike in the several Figures.

DETAILED DESCRIPTION

Figure 1:
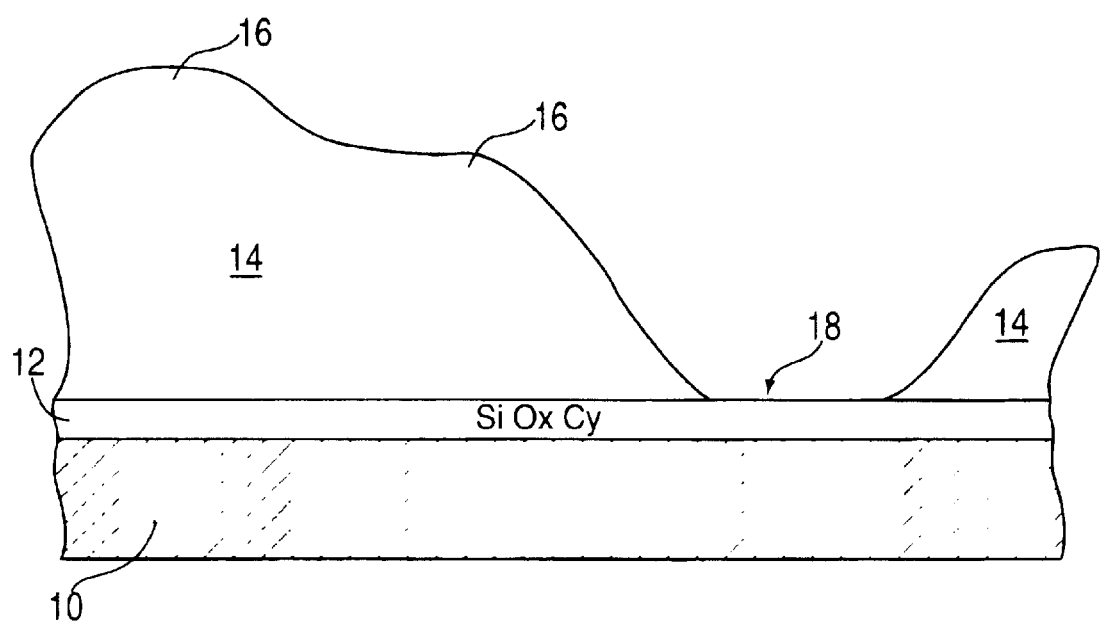
FIG. 1 is a cross-sectional view illustrating a misapplied layer of dielectric polymer to a semiconductor wafer.

Referring initially to FIG. 1, there is shown a misapplied layer of dielectric polymer to a semiconductor wafer. An underlying film of, for example, silicon nitride 10 (SiN) formed upon a substrate (not shown) has a layer 12 of adhesion promoter applied thereon. One example of such an adhesion promoter is AP4000, which is also manufactured by The Dow Chemical Company. The adhesion promoter layer 12 has a general chemical composition of $SiO_xC_y$, and is applied at a thickness which may range from about 5 to about 150 angstroms (Å). Then, a low-k dielectric spin-on polymer film 14 (such as SiLK®) is applied upon the adhesion promoter layer 12.

In the normal application of the SiLK® polymer, it is desired that the resulting dielectric film 14 be of a fairly uniform thickness, particularly where applied over relatively planarized areas of the wafer. As mentioned previously, however, there is the possibility that due to some type of process/equipment malfunction, there may be areas of non-uniform thickness of the applied dielectric film. For example, a "short shot" problem describes a situation where there is a malfunction in the amount of dielectric polymer (too little) applied to the wafer during the spin-on process. With too little dielectric initially applied, it is likely that there will be insufficient coverage over the entire surfaces of the wafer. Some surfaces might have sufficient dielectric coating, while other surfaces might have insufficient or no coating at all. This is illustrated in FIG. 1.

As seen in FIG. 1, an exemplary process defect such as a "short-shot" problem results in a non-uniform dielectric coating. Specifically, dielectric film 14 includes regions 16 of excess pile-up of dielectric material, while there are also bare patches 18 where there is no dielectric material covering the adhesion promoter layer 12. Another example of a potential misapplication of dielectric polymer might be as a result of human error. If the wrong chemical recipe was introduced or the spin-on time were programmed for an incorrect duration, similar non-planarization conditions could arise. In any event, the misapplied dielectric film 14 should be removed and reapplied while, at the same time, protecting the underlying films on the wafer if the wafer is to be salvaged for further processing.

Figure 2:
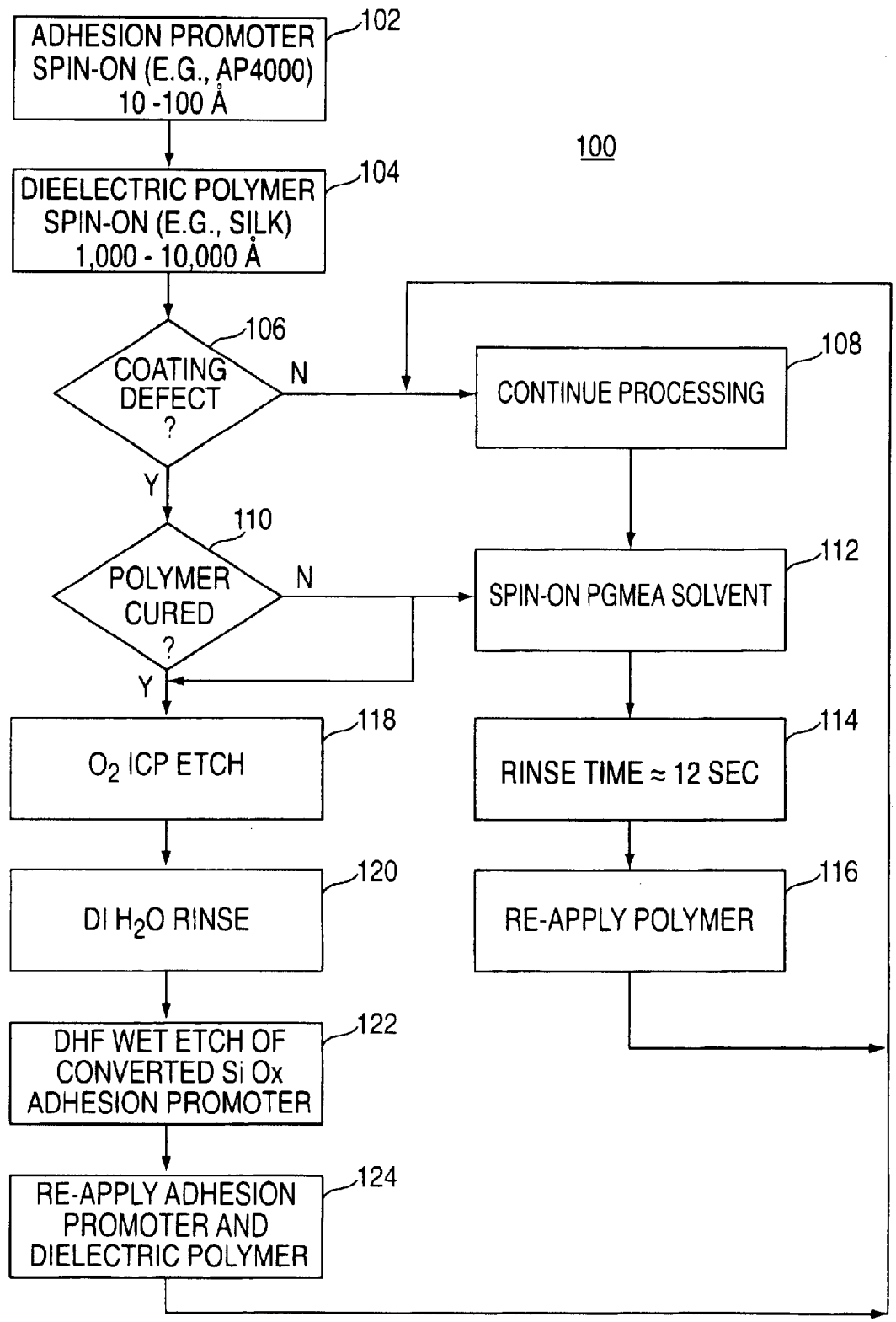
FIG. 2 is a flow diagram which illustrates a method for implementing a rework process for a dielectric layer formed upon a semiconductor wafer, in accordance with an embodiment of the invention.

Therefore, in accordance with an embodiment of the invention, there is disclosed a method 100 for implementing a rework process for a dielectric layer formed upon a semiconductor wafer. FIG. 2 is a flow diagram which illustrates an embodiment of method 100.

Method 100 begins at block 102 with the application of an adhesion promoter (e.g., AP4000) to a semiconductor wafer. As with the dielectric material, the adhesion promoter layer 12 is applied in a spin-on fashion. A preferred thickness of the adhesion promoter layer 12 may range from about 10 Å to about 100 Å. Then, at block 104, the spin-on dielectric material (e.g., SiLK®) is applied to the adhesion promoter layer 12. Once applied, the resulting dielectric film 14 may or may not be cured before it is examined for any coating defects as discussed above. At decision block 106, if it is determined that there are no coating defects associated with the dielectric film 14, then method 100 continues to block 108 for further processing.

On the other hand, if it is determined that there is in fact a coating defect with the dielectric film 14, then method 100 proceeds to decision block 110. Depending upon whether or not the dielectric film 14 has been cured at this point, there may be an alternative procedure for removing the film 14. Thus, if at decision block 110, the dielectric film 14 has not been cured, method 100 may proceed to block 112 for a wet etch process.

If the SiLK® polymer is uncured, it is soluble in propylene glycol monomethyl ether acetate (PGMEA). Further, PGMEA has a high etch selectivity with regard to the underlying film 10 (SiN, in this example), as well as the adhesion promoter layer 12 when it is baked above 175° C. This wet etch is carried out as a spin-on process for a duration of about 12 seconds, as indicated at block 114, wherein the PGMEA solvent has been shown to remove about 2,800 Å to about 7,000 Å of dielectric film. Then, a new layer of dielectric polymer may be applied at block 116. Assuming that there are no further application defects, method 100 proceeds to block 108 for further processing.

In the event that the dielectric film 14 has already been cured upon the discovery of application defects (or, as an alternative to wet etching even if the film has not been cured), method 100 proceeds to block 118 for a dry etch rework. In a preferred embodiment, the dry etch rework employs an oxygen inductively-coupled plasma source (ICP), which is known in the art. This $O_2/N_2H_2$ inductively-coupled downstream plasma rework may be performed on either cured or uncured SiLK®, and also has excellent selectivity with regard to the underlying adhesion promoter layer 12, as well as the SiN film 10. In a preferred embodiment, the etch selectivity ratio is at least 1000:1. Following the removal of the cured/uncured SiLK®, the wafer is then rinsed with deionized water at block 120.

Figure 3:
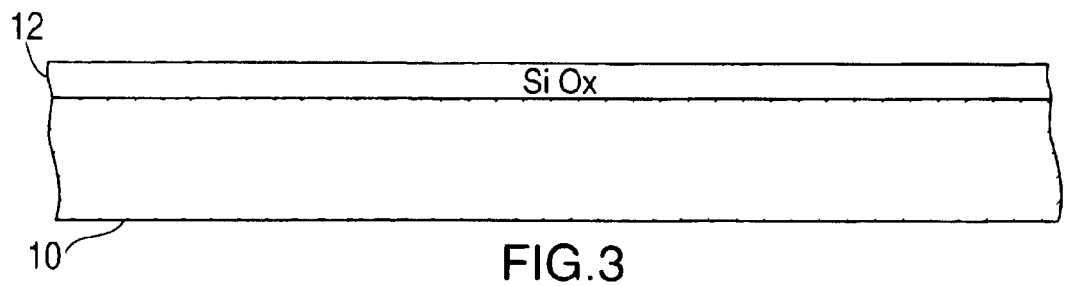
FIG. 3 illustrates the removal of the misapplied dielectric layer and the resulting oxidation of the adhesion promoter layer thereunderneath, in accordance with one embodiment of the invention.

A side benefit of the ICP dry etch is its effect upon the adhesion promoter layer 12. Again, while the ICP dry etch is selective to the adhesion promoter layer 12 (the adhesion promoter layer 12 being a composite of silicon, oxygen and carbon), the etch also serves to oxidize the adhesion promoter layer 12. As a result, the adhesion promoter layer 12 is converted from the general chemical composition of $SiO_xC_y$ to $SiO_x$, shown in FIG. 3. In so doing, the ICP etch thus allows the oxidized adhesion promoter layer 12 to be removed by a hydrofluoric acid wet etch.

Figure 4:
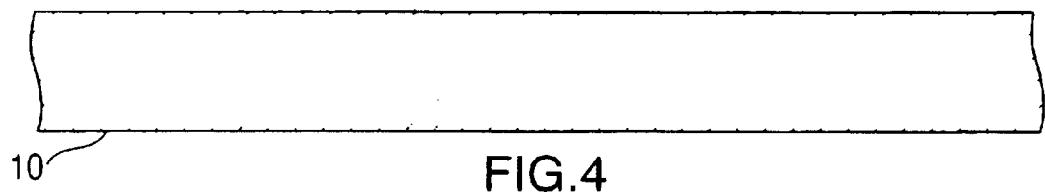
FIG. 4 illustrates the removal of the oxidized adhesion promoter layer using a DHF wet etch.
Figure 5:
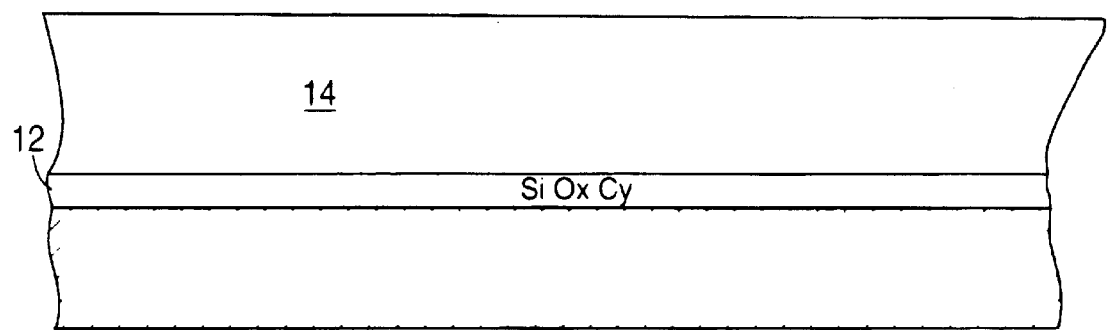
FIG. 5 illustrates the application of a new adhesion promoter layer and dielectric layer following the removal etch process(es).

Thus, referring back to FIG. 2, method 100 proceeds to block 122 where the adhesion promoter layer 12 is wet-etched with a dilute hydrofluoric acid (DHF). Because the adhesion promoter layer 12 has been oxidized by the ICP dry etch, the DHF etch provides a uniform removal thereof, as shown in FIG. 4. In addition, the etch selectivity of the DHF etch with respect to the underlying SiN layer should be at least 5:1. Finally, a new layer of adhesion promoter and dielectric polymer is applied at block 124, and method 100 may continue to block 108 for further wafer processing or, alternatively, to decision block 106 for a determination of whether the dielectric has now been correctly applied. A dielectric layer 14 without process defects is illustrated in FIG. 5.

It will be seen from the foregoing that the present embodiments provide an effective means for reworking and removing a defectively applied spin-on dielectric polymer. If the polymer has not yet been cured, then it may be removed either by a wet etch (dissolving in PGMEA) or by an ICP dry etch followed by a DBF wet etch of the adhesion promoter layer. If cured, then the ICP dry etch is used. In either case, the effective removal of the misapplied dielectric is accomplished with little or no removal of any underlying layers on the semiconductor wafer.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for removing a misapplied dielectric layer formed upon a semiconductor substrate, the method comprising:
    subjecting the dielectric layer to a dry etch process until the misapplied dielectric layer is completely removed from the substrate; and
    subjecting an adhesion promoter layer underneath the removed dielectric layer so a wet etch process until the adhesion promoter layer is completely removed from the substrate;
    wherein said dry etch process causes said adhesion promoter layer to become oxidized, and wherein said wet etch process further comprises a dilute hydrofluoric acid (DHF) etch.

2. The method of claim 1, wherein said dry etch process further comprises an oxygen inductively coupled plasma (ICP) etch.

3. The method of claim 2, wherein said adhesion promoter layer has a first general chemical composition of $SiO_xC_y$ prior to said dry etch process and a second general chemical composition of $SiO_x$ following said dry etch process.

4. The method of claim 2, wherein said ICP etch has an etch selectivity of at least 1000:1 with respect so said adhesion promoter layer.

5. The method of claim 1, wherein said DHF etch has an etch selectivity of at least 5:1 with respect to a layer underneath said adhesion promoter layer.

6. A method for implementing a rework process for a cured dielectric layer formed upon a semiconductor wafer, the method comprising:
    determining that a coating defect exists with the dielectric layer;
    implementing a dry etch process to completely remove the dielectric layer;
    implementing a wet etch process to completely remove an adhesion promoter layer formed underneath the dielectric layer, said wet etch process further comprising a dilute hydrofluoric acid (DHF) etch; and applying a new adhesion promoter layer and a new dielectric layer to the substrate.

7. The method of claim 6, wherein said dry etch process further comprises an oxygen inductively coupled plasma (ICP) etch.

8. The method of claim 7, wherein said dry etch process results in the oxidation of said adhesion promoter layer.

9. The method of claim 8, wherein said adhesion promoter layer has a first general chemical composition of $SiO_xC_y$ prior to said dry etch process and a second general chemical composition of $SiO_x$ following said dry etch process.

10. The method of claim 7, wherein said ICP etch has an etch selectivity of at least 1000:1 with respect to said adhesion promoter layer.

11. The method of claim 6, wherein said DHF etch has an etch selectivity of at least 5:1 with respect to a layer underneath said adhesion promoter layer.

12. A method for implementing a rework process for an uncured dielectric layer formed upon a semiconductor wafer, the method comprising:
    determining that a coating defect exists with the dielectric layer;
    implementing a wet etch process to completely remove the dielectric layer such that an adhesion promoter layer originally formed underneath the dielectric layer is left substantially intact, said wet etch process further comprises a propylene glycol monomethyl ether acetate (PGMEA) etch; and
    applying a new dielectric layer to the adhesion promoter layer.

13. The method of claim 12, wherein said wet etch process is a spin-on etch process.

14. The method of claim 12, wherein said spin-on etch process is implemented for a duration of about 12 seconds.

* * * * *